US012641931B2

(12) United States Patent
Hu et al.

(10) Patent No.: US 12,641,931 B2
(45) Date of Patent: May 26, 2026

(54) DISPLAY DEVICE

(71) Applicant: HARVATEK CORPORATION,
Hsinchu City (TW)

(72) Inventors: Yu-Chang Hu, Hsinchu City (TW);
Bo-Ren Lin, Hsinchu City (TW);
Hsin-I Lu, Hsinchu County (TW);
Shyi-Ming Pan, Miaoli County (TW);
Feng-Hui Chuang, New Taipei City
(TW)

(73) Assignee: HARVATEK CORPORATION,
Hsinchu City (TW)

( * ) Notice: Subject to any disclaimer, the term of this
patent is extended or adjusted under 35
U.S.C. 154(b) by 387 days.

(21) Appl. No.: 18/466,799

(22) Filed: Sep. 13, 2023

(65) Prior Publication Data

US 2025/0006871 A1     Jan. 2, 2025

(30) Foreign Application Priority Data

Jun. 30, 2023     (TW) ................................. 112124489

(51) Int. Cl.
*H10H 20/851*     (2025.01)
*H10W 90/00*     (2026.01)
(52) U.S. Cl.
CPC ........ *H10H 20/8512* (2025.01); *H10W 90/00*
(2026.01)
(58) Field of Classification Search
CPC .. H10H 20/8512; H10H 29/851; H10H 29/30;
H10H 29/842; H10H 29/8552; H01L
25/167
See application file for complete search history.

(56) References Cited

U.S. PATENT DOCUMENTS

| | | | | |
|---|---|---|---|---|
| 2010/0314647 A1* | 12/2010 | Won | ................... | H10H 20/8516 |
| | | | | 257/E33.056 |
| 2017/0186907 A1* | 6/2017 | Chaji | ................... | H10H 20/052 |
| 2017/0229430 A1* | 8/2017 | Lai | ....................... | H01L 25/0753 |
| 2020/0183228 A1* | 6/2020 | Chen | ................ | G02F 1/133621 |
| 2021/0376272 A1* | 12/2021 | You | ....................... | H10K 50/125 |

FOREIGN PATENT DOCUMENTS

| | | | | |
|---|---|---|---|---|
| CN | 115050794 A | * | 9/2022 | ............. H10D 86/60 |
| TW | M576667 U | | 4/2019 | |
| TW | 201933605 A | | 8/2019 | |
| TW | I790121 B | * | 1/2023 | |
| TW | I796598 B | | 3/2023 | |

* cited by examiner

*Primary Examiner* — Eliseo Ramos Feliciano
*Assistant Examiner* — Sophia W Kao
(74) *Attorney, Agent, or Firm* — Li & Cai Intellectual
Property Office

(57)     ABSTRACT

A display device having a wide color gamut includes a
backplane, a light emitting group, a protective layer, and a
color conversion structure. The light emitting group is
disposed on the backplane, and includes a plurality of blue
light emitting elements arranged at intervals. The protective
layer encapsulates the blue light emitting elements in a
lateral direction to expose their light emitting surfaces. The
color conversion structure is disposed on the light emitting
group to convert light from one portion of the blue light
emitting elements into red light and green light and allow
light from another one portion of the blue light emitting
elements to pass through. The protective layer has a trans-
mittance of 10% or less of light having a wavelength greater
than 380 nm and less than 500 nm.

7 Claims, 4 Drawing Sheets

DISPLAY DEVICE

CROSS-REFERENCE TO RELATED PATENT APPLICATION

This application claims the benefit of priority to Taiwan Patent Application No. 112124489, filed on Jun. 30, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a display device, and more particularly to a display device having a wide color gamut that can prevent sub-pixels from being interfered by any undesired interior or exterior blue light.

BACKGROUND OF THE DISCLOSURE

With the development of technology, novel display technologies have made great progress in terms of display image quality, color performance, and energy consumption. Among various display technologies, mini LEDs, micro LEDs, or organic LEDs are considered to be the key to next-generation display technology.

LED display is a type of display that uses LED arrays integrated on a substrate as display pixels, requiring a very large number of mini LEDs, micro LEDs or organic LEDs to achieve a screen display, and requiring a color conversion device to achieve a full-color display. However, the conventional color conversion device has a complex structure, commonly including: a red conversion unit composed of a red quantum dot layer and a red filter, a green conversion unit composed of a green quantum dot layer and a green filter, a light-permeable unit composed of a transparent layer and a blue filter, and a separation layer for separating the red conversion unit, the green conversion unit, and the light-permeable unit from each other. Such a structure necessitates a complex process of at least seven manufacturing steps, and may contribute to higher processing difficulty, which is not advantageous for production of LED displays.

SUMMARY OF THE DISCLOSURE

In response to the above-referenced technical inadequacies, one of the objectives of the present disclosure is to provide a display device having a wide color gamut which can prevent sub-pixels from interfering with each other and block blue light from the external environment, so as to achieve a stable, high-quality, wide color gamut display effect.

Another one of the objectives of the present disclosure is to provide a simplified and optimized color conversion structure to reduce the number of manufacturing process steps, so as to reduce overall process difficulty, thereby increasing production efficiency and process yield, as well as improving the color purity of the sub-pixels and increasing display color gamut.

In order to solve the above-mentioned problems, one of the technical aspects adopted by the present disclosure is to provide a display device having a wide color gamut, which includes a backplane, a light emitting group, a protective layer, and a color conversion structure. The backplane has a first area, a second area, and a third area arranged at intervals. The light emitting group is disposed on the backplane, and includes a first blue light emitting element located in the first area, a second blue light emitting element located in the second area, and a third blue light emitting element located in the third area. The protective layer is disposed on the backplane, and encapsulates the first blue light emitting element, the second blue light emitting element, and the third blue light emitting element in a lateral direction to expose a light emitting surface of each of the first blue light emitting element, the second blue light emitting element, and the third blue light emitting element. The color conversion structure includes a red conversion unit, a green conversion unit, a light-permeable unit, and a black matrix. The red conversion unit is disposed on the light emitting surface of the first blue light emitting element. The green conversion unit is disposed on the light emitting surface of the second blue light emitting element. The light-permeable unit is disposed on the light emitting surface of the third blue light emitting element. The black matrix is disposed between the red conversion unit, the green conversion unit, and the light-permeable unit. The protective layer has a transmittance of 10% or less of light having a wavelength greater than 380 nm and less than 500 nm.

In one of the possible or preferred embodiments, the protective layer includes a yellow absorbing material that is a yellow organic pigment, a yellow inorganic pigment, or a combination thereof.

In one of the possible or preferred embodiments, the yellow absorbing material is bismuth vanadate ($BiVO_4$).

In one of the possible or preferred embodiments, the protective layer is a photoresist layer.

In one of the possible or preferred embodiments, the red conversion unit includes a red conversion sheet and a first blue light-cutoff sheet disposed on the red conversion sheet. The green conversion unit includes a green conversion sheet and a second blue light-cutoff sheet disposed on the green conversion sheet. Both the first blue light-cutoff sheet and the second blue light-cutoff sheet have a transmittance of 10% or less of light having a wavelength greater than 380 nm and less than 500 nm. The light-permeable unit is a transparent layer.

In one of the possible or preferred embodiments, the color conversion structure includes a cover board that has an inner surface close to the light emitting group, and the red conversion unit, the green conversion unit, the light-permeable unit, and the black matrix are formed on the inner surface.

In one of the possible or preferred embodiments, each of the first blue light-cutoff sheet and the second blue light-cutoff sheet is formed from a photoresist material, and the photoresist material includes the yellow absorbing material accounting for 5 wt % to 20 wt % of a total weight thereof.

In one of the possible or preferred embodiments, each of the first blue light emitting element, the second blue light emitting element, and the third blue light emitting element includes a first type semiconductor layer, a second type semiconductor layer, an active layer, and two electrodes. The first type semiconductor layer is close to the backplane. The second type semiconductor layer is close to the color conversion structure. The active layer is disposed between the first type semiconductor layer and the second type semiconductor layer. The two electrodes are disposed on the first type semiconductor layer to face towards the backplane and electrically connected to the first type semiconductor layer and the second type semiconductor layer, respectively. Each of the first area, the second area, and the third area has two connection pads disposed therein. The two electrodes of the first blue light emitting element are respectively and electrically connected to the two connection pads of the first area. The two electrodes of the second blue light emitting element are respectively and electrically connected to the two connection pads of the second area. The two electrodes of the third blue light emitting element are respectively and electrically connected to the two connection pads of the third area.

In one of the possible or preferred embodiments, each of the first blue light emitting element, the second blue light emitting element, and the third blue light emitting element includes a first type semiconductor layer, a second type semiconductor layer, an active layer, and two electrodes. The first type semiconductor layer is close to the color conversion structure. The second type semiconductor layer is close to the backplane. The active layer is disposed between the first type semiconductor layer and the second type semiconductor layer. One of the two electrodes is disposed on the first type semiconductor layer to face towards the color conversion structure, and the other of the two electrodes is disposed on the second type semiconductor layer to face towards the color conversion structure. The backplane has a plurality of connection pads disposed thereon that are alternately arranged with the first blue light emitting element, the second blue light emitting element, and the third blue light emitting element. The two electrodes of the first blue light emitting element, the second blue light emitting element, or the third blue light emitting element are electrically connected to the corresponding two of the connection pads.

In one of the possible or preferred embodiments, each of the first blue light emitting element, the second blue light emitting element, and the third blue light emitting element includes a first type semiconductor layer, a second type semiconductor layer, an active layer, and an electrode. The first type semiconductor layer is close to the color conversion structure. The second type semiconductor layer is close to the backplane. The active layer is disposed between the first type semiconductor layer and the second type semiconductor layer. The electrode is disposed on the second type semiconductor layer to face towards the backplane. The display device includes a circuit layer disposed on the protective layer. The backplane has a plurality of connection pads disposed thereon. The first type semiconductor layer of the first blue light emitting element, the second blue light emitting element, or the third blue light emitting element is electrically connected to the circuit layer. The electrode of the first blue light emitting element, the second blue light emitting element, or the third blue light emitting element is electrically connected to the corresponding one of the connection pads.

Therefore, in the display device having a wide color gamut provided by the present disclosure, by virtue of "the protective layer encapsulating the first blue light emitting element, the second blue light emitting element, and the third blue light emitting element in a lateral direction to expose a light emitting surface of each of the first blue light emitting element, the second blue light emitting element, and the third blue light emitting element," and "the protective layer having a transmittance of 10% or less of light having a wavelength greater than 380 nm and less than 500 nm," any problems caused by excess or undesired blue light in the device can be eliminated, thereby avoiding degradation of color gamut caused by side light interference between sub-pixels, and blue light from the external environment can be blocked from negatively affecting the display effect.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
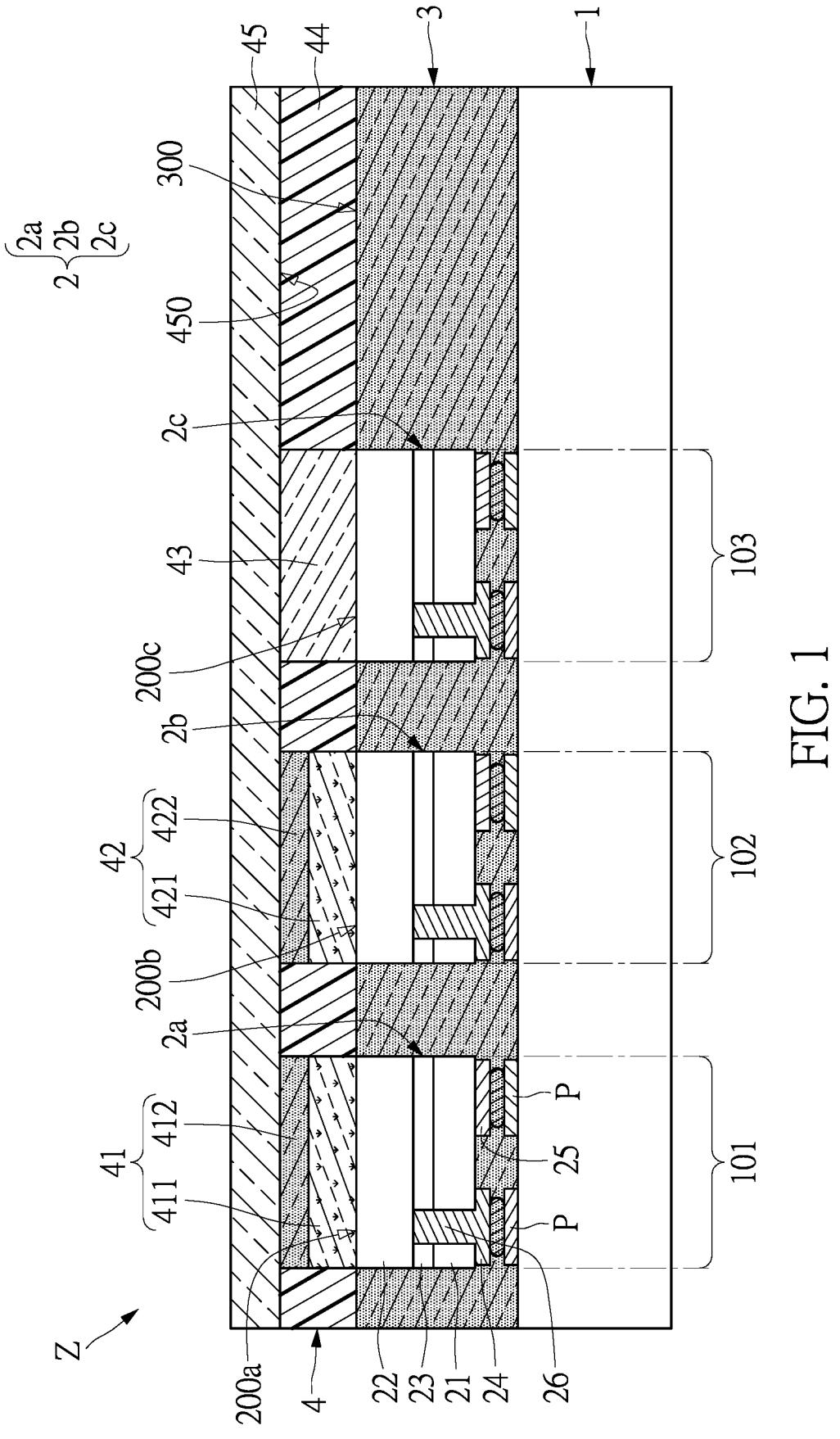
FIG. 1 is a structural schematic side view of a display device having a wide color gamut according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Unless otherwise stated, the material(s) used in any described embodiment is/are commercially available material(s) or may be prepared by methods known in the art, and the process(es) or method(s) used in any described embodiment is/are conventional process(es) or method(s) generally known in the related art.

Figure 2:
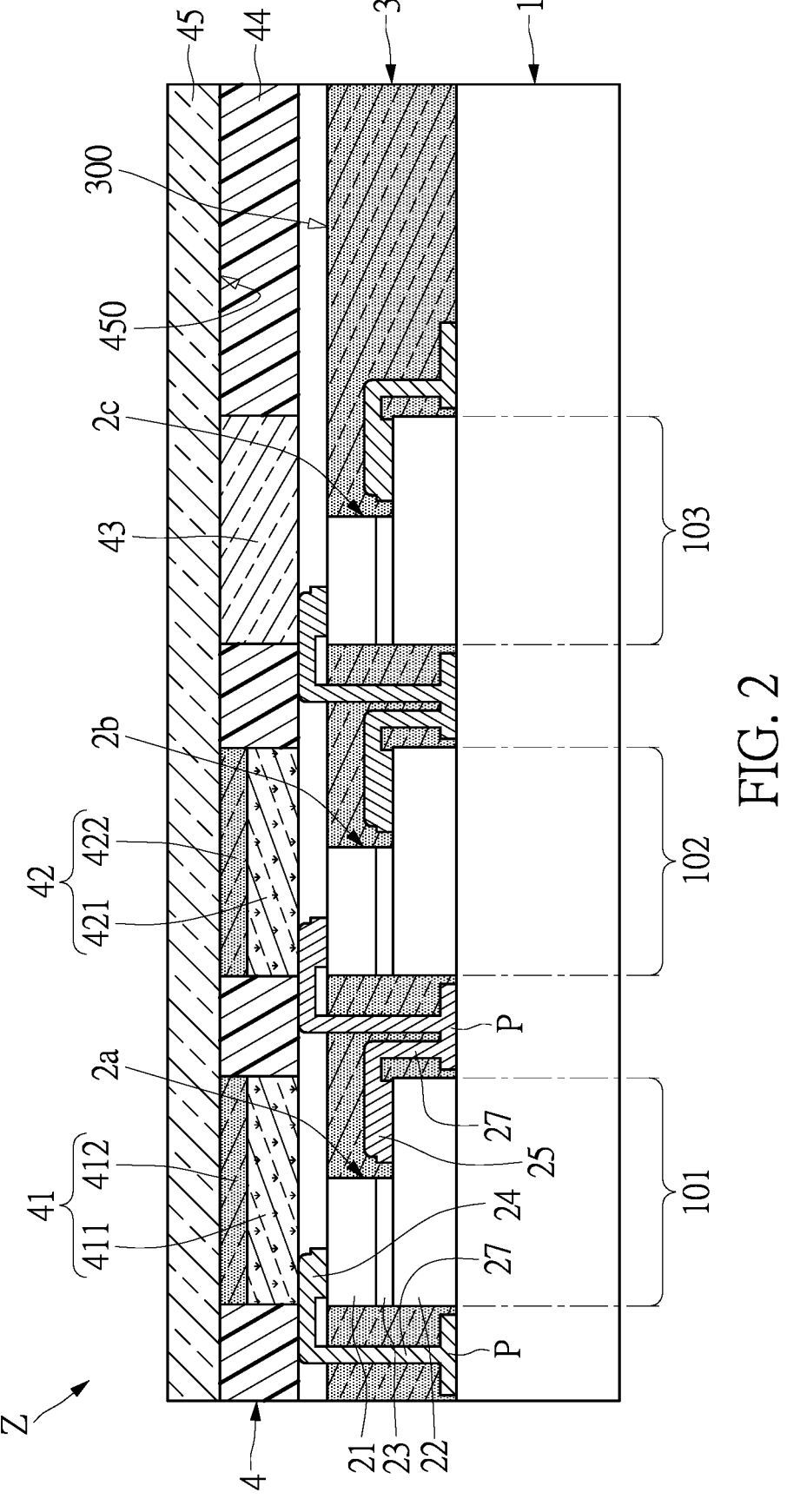
FIG. 2 is a structural schematic side view of a display device having a wide color gamut according to a second embodiment of the present disclosure.
Figure 3:
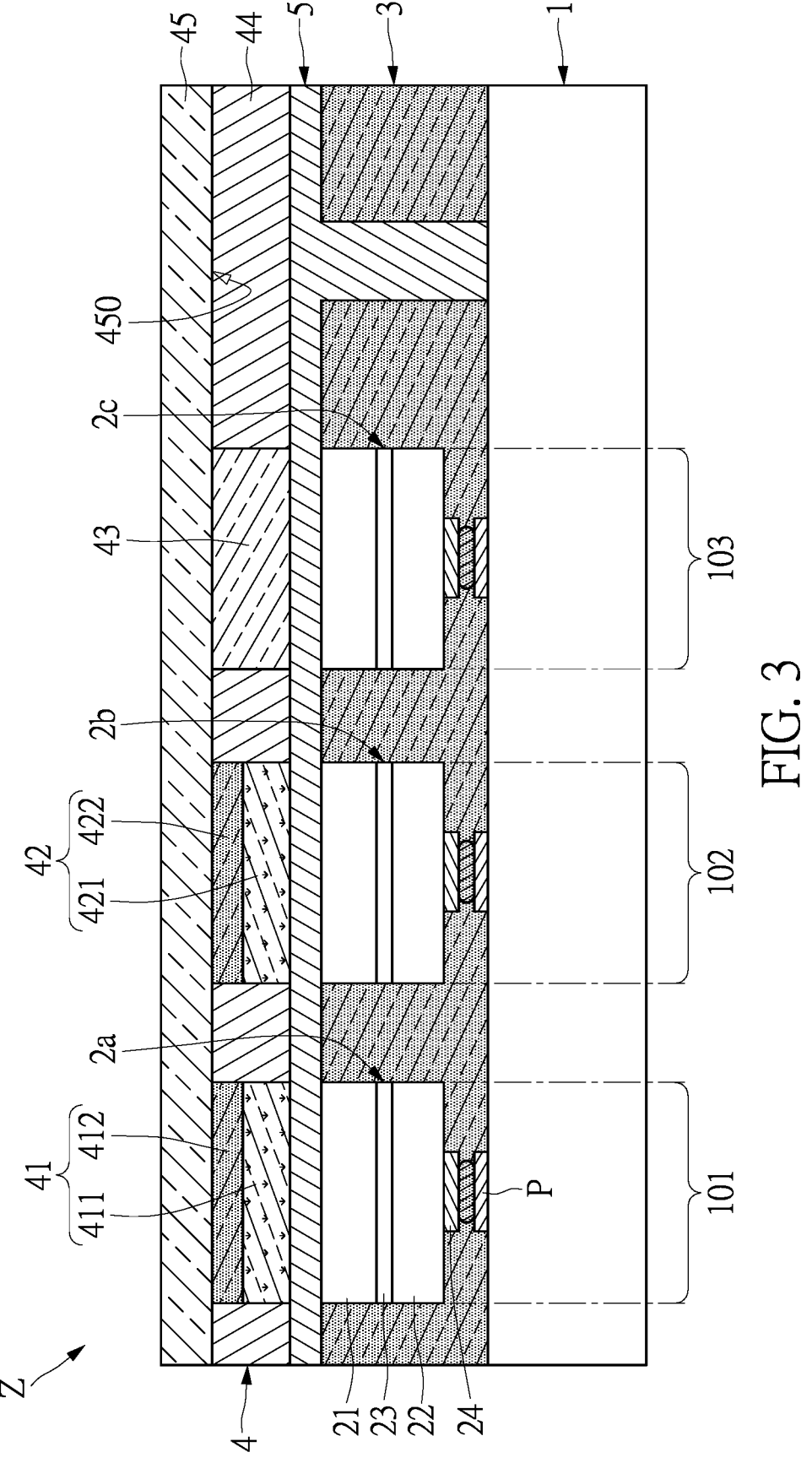
FIG. 3 is a structural schematic side view of a display device having a wide color gamut according to a third embodiment of the present disclosure.

Referring to FIG. 1 to FIG. 3, a display device Z having a wide color gamut according to embodiments of the present disclosure is shown. As shown in FIG. 1 to FIG. 3, the display device Z includes a backplane 1, a light emitting group 2, a protective layer 3, and a color conversion structure 4. The light emitting group 2 is disposed on the backplane 1, and includes a first blue light emitting element 2a, a second blue light emitting element 2b, a third blue light emitting element 2c that are disposed in a predetermined arrangement and have the same structure. The first blue light emitting element 2a is used to form a red sub-pixel, the second blue light emitting element 2b is used to form a green sub-pixel, and the third blue light emitting element 2c is used to form a blue sub-pixel. The protective layer 3 encapsulates the first blue light emitting element 2a, the second blue light emitting element 2b, and the third blue light emitting element 2c in a lateral direction to expose their light emitting surfaces 200. The color conversion structure 4 is disposed on the light emitting group 2. The color conversion structure 4 can convert blue light emitted from the first blue light emitting element 2a into red light and convert blue light emitted from the second blue light emitting element 2b into green light, and can allow blue light emitted from the third blue light emitting element 2c to pass there-through.

In use, the brightness of the first blue light emitting element 2a, the second blue light emitting element 2b, and the third blue light emitting element 2c can be controlled via the backplane 1, so that the lights exiting from the color conversion structure 4 are mixed into lights of different colors, thereby realizing a full-color display. It is worth mentioning that the protective layer 3 has a transmittance of 10% or less of light having a wavelength greater than 380 nm and less than 500 nm. Therefore, interference between red, green, and blue sub-pixels can be prevented and blue light from the external environment can be blocked, thereby achieving a stable, high-quality, wide color gamut display effect.

Although only the first blue light emitting element 2a, the second blue light emitting element 2b, and the third blue light emitting element 2c are shown in FIG. 1 to FIG. 3, in practice, the light emitting group 2 may further include an additional number of blue light emitting elements to form a desired number of pixel units. That is, the present disclosure is not limited in terms of the number of blue light emitting elements.

In one embodiment of the present disclosure, the backplane 1 is a driving substrate with a driving circuit (not shown in FIG. 1 to FIG. 3), such as a TFT (Thin Film Transistor) driving circuit. If necessary, the backplane 1 can include a flexible material to provide a bendable effect. The backplane 1 has a first area 101, a second area 102, and a third area 103 arranged at intervals. The first blue light emitting element 2a is located in the first area 101. The second blue light emitting element 2b is located in the second area 102. The third blue light emitting element 2c is located in the third area 103. Furthermore, the first blue light emitting element 2a, the second blue light emitting element 2b, and the third blue light emitting element 2c are electrically connected to the driving circuit. Accordingly, the backplane 1 can provide drive signals according to an image to be displayed, and the first blue light emitting element 2a, the second blue light emitting element 2b, and the third blue light emitting element 2c can emit lights of different brightness in response to the respective drive signals. Each of the first blue light emitting element 2a, the second blue light emitting element 2b, and the third blue light emitting element 2c can be a mini LED, a micro LED, or an organic LED, but is not limited thereto.

Figure 4:
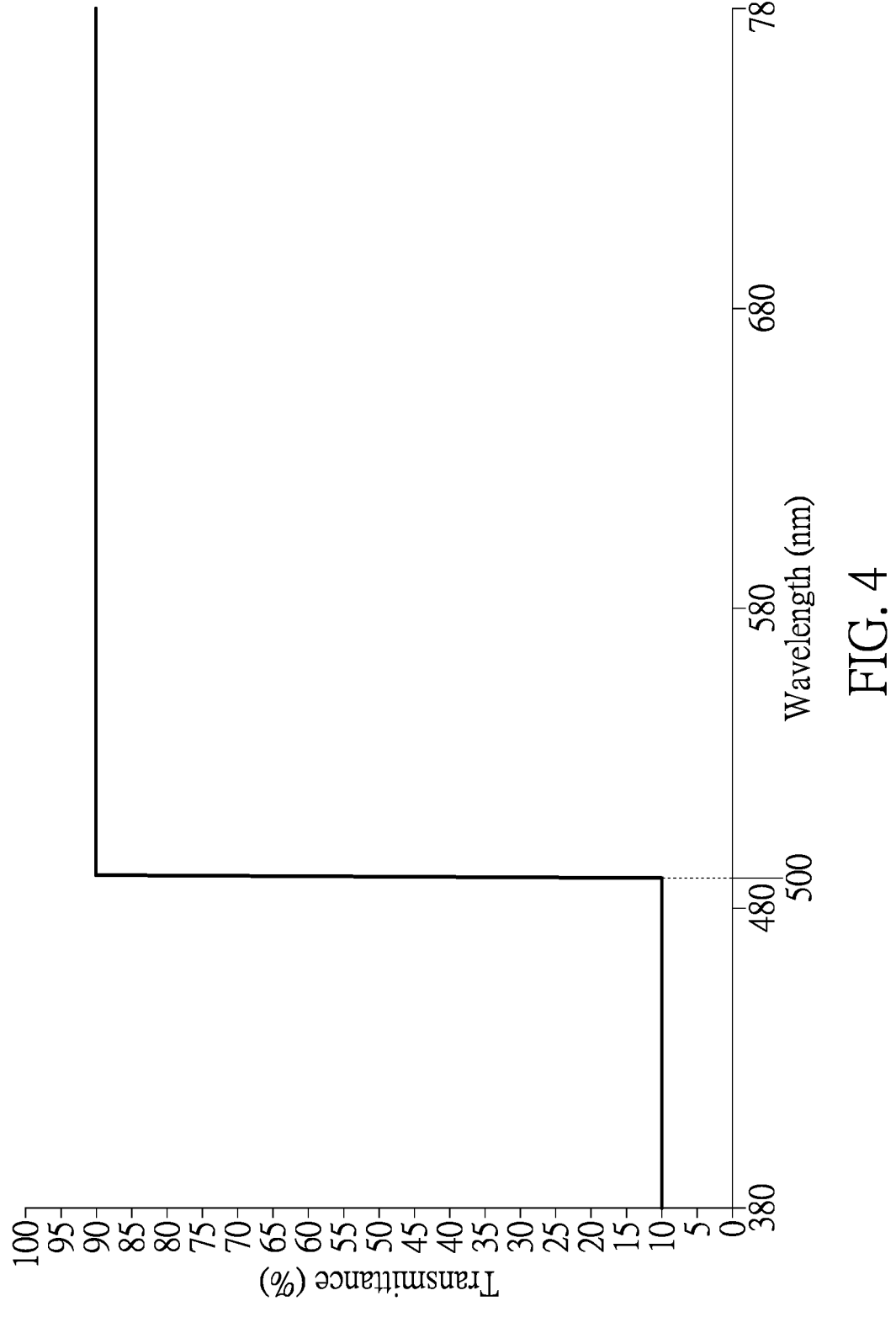
FIG. 4 shows a transmittance spectrum of a protective layer or a blue light-cutoff sheet of the display device according to the first, second, and third embodiments of the present disclosure, which includes a yellow absorbing material.

It should be noted that the protective layer 3 is a photoresist layer that can be formed from a first photoresist material (i.e., a yellow photosensitive resin composition) by exposure and development, which is advantageous for reducing production costs and increasing production efficiency. The first photoresist material can include a resin, a yellow absorbing material, a photoinitiator, a dispersant, and a solvent. In practice, the resin can be a methacrylic resin or an epoxy resin. The yellow absorbing material can be a yellow organic pigment, a yellow inorganic pigment, or the combination thereof. Examples of the yellow organic pigment include C.I. Pigment Yellow 12, 13, 14, 17, 20, 24, 31, 55, 83, 93, 109, 110, 128, 138, 139, 150, 153, 154, 155, 166, 168, 180, 185, 211, and 219. Examples of the yellow inorganic pigment include bismuth yellow (e.g., bismuth vanadate, $BiVO_4$), chromium yellow, iron oxide yellow, cadmium yellow, and titanium yellow pigments. Preferably, the yellow absorbing material accounts for 5 wt % to 20 wt % of a total weight of the first photoresist material. Therefore, the protective layer 3 can prevent the transmission of blue light and allow light having a longer wavelength (e.g., green light or red light) to transmit therethrough. The protective layer 3 has a transmittance spectrum as shown in FIG. 4, in which a transmittance of light having a wavelength greater than 380 nm and less than 500 nm is 10% or less, and a transmittance of light having a wavelength greater than 500 nm is greater than 90%.

In certain embodiments, the yellow absorbing material accounts for 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt % of the total weight of the first photoresist material.

In the present disclosure, the yellow absorbing material is included in the protective layer 3, and the light emitting surface 200a, 200b, 200c of each of the first blue light emitting element 2a, the second blue light emitting element 2b, and the third blue light emitting element 2c is substantially flush with a surface 300 of the protective layer 3 that is close to the color conversion structure 4, i.e., the light emitting surface 200a, 200b, 200c and the surface 300 have no or only a small degree of surface height difference therebetween, the color conversion structure 4 does not require any blue light filter sheets. Furthermore, one or more blue light-cutoff sheets are used in the color conversion structure 4, so that the color conversion structure 4 does not require green light and red light filter sheets, i.e., the green light and red light filter sheets are replaced by the blue light-cutoff sheets. Therefore, the number of the manufacturing process steps can be reduced, so as to reduce overall processing difficulty, thereby increasing production efficiency and process yield, as well as reducing production costs.

More specifically, the color conversion structure 4 includes a red conversion unit 41, a green conversion unit 42, a light-permeable unit 43, and a black matrix 44. The red conversion unit 41 is disposed on the light emitting surface 200a of the first blue light emitting element 2a, and includes a red conversion sheet 411 and a first blue light-cutoff sheet 412 disposed on the red conversion sheet 411. The green conversion unit 42 is disposed on the light emitting surface 200*b* of the second blue light emitting element 2*b*, and includes a green conversion sheet 421 and a second blue light-cutoff sheet 422 disposed on the green conversion sheet 421. The light-permeable unit 43 is disposed on the light emitting surface 200*c* of the third blue light emitting element 2*c*, and can be a transparent layer. The black matrix 44 is disposed between the red conversion unit 41, the green conversion unit 42, and the light-permeable unit 43, so as to separate the red conversion unit 41, the green conversion unit 42, and the light-permeable unit 43 from each other.

In the present disclosure, the first blue light-cutoff sheet 412 and the second blue light-cutoff sheet 422 in the color conversion structure 4 also have a transmittance of 10% or less of light having a wavelength greater than 380 nm and less than 500 nm, and can have a synergistic or cooperative effect with the protective layer 3 to improve the color purity of the sub-pixels and increase display color gamut.

In practice, the red conversion sheet 411 can be a red quantum dot sheet, and the green conversion sheet 421 can be a green quantum dot sheet, but the present disclosure is not limited thereto. The first blue light-cutoff sheet 412 and the second blue light-cutoff sheet 422 can be formed from a second photoresist material (i.e., another yellow photosensitive resin composition) by exposure and development. The second photoresist material can be the same as or different from the first photoresist material. For example, the second photoresist material can include a resin, a yellow absorbing material, a photoinitiator, a dispersant, and a solvent. The resin can be a methacrylic resin or an epoxy resin. The yellow absorbing material can be a yellow organic pigment, a yellow inorganic pigment, or the combination thereof. Specific examples of the yellow organic pigment and the yellow inorganic pigment are as described above. Preferably, the yellow absorbing material accounts for 5 wt % to 20 wt % of a total weight of the second photoresist material. Therefore, the first blue light-cutoff sheet 412 and the second blue light-cutoff sheet 422 also have the transmittance spectrum as shown in FIG. 4.

In certain embodiments, the yellow absorbing material accounts for 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt % of the total weight of the second photoresist material.

According to particular requirements, the color conversion structure 4 can further include a cover board 45 that has an inner surface 450 close to the light emitting group 2. The red conversion unit 41, the green conversion unit 42, the light-permeable unit 43, and the black matrix 44 are formed on the inner surface 450 of the cover board 45 and then combined with the backplane 1 that has the light emitting group 2 and the protective layer 3 disposed thereon.

First Embodiment

Referring to FIG. 1, each of the first blue light emitting element 2*a*, the second blue light emitting element 2*b*, and the third blue light emitting element 2*c* is a flip-chip LED die, which includes a first type semiconductor layer 21, a second type semiconductor layer 22, an active layer 23, and two electrodes 24, 25. The first type semiconductor layer 21 is close to the backplane 1. The second type semiconductor layer 22 is close to the color conversion structure 4. The active layer 23 is disposed between the first type semiconductor layer 21 and the second type semiconductor layer 22.

The two electrodes 24, 25 are disposed on the first type semiconductor layer 21 to face towards the backplane 1, in which the electrode 24 is electrically connected to the second type semiconductor layer 22 via a conductive hole 26.

Furthermore, each of the first area 101, the second area 102, and the third area 103 of the backplane 1 has two connection pads P disposed therein. In the present embodiment, the two electrodes 24, 25 of the first blue light emitting element 2*a* are respectively and electrically connected to the two connection pads P of the first area 101. The two electrodes 24, 25 of the second blue light emitting element 2*b* are respectively and electrically connected to the two connection pads P of the second area 102. The two electrodes 24, 25 of the third blue light emitting element 2*c* are respectively and electrically connected to the two connection pads P of the third area 103. More specifically, each of the two electrodes 24, 25 of the first blue light emitting element 2*a*, the second blue light emitting element 2*b*, or the third blue light emitting element 2*c* is connected to the corresponding connection pad P via a conductive bump (not labeled in the drawings).

Second Embodiment

Referring to FIG. 2, each of the first blue light emitting element 2*a*, the second blue light emitting element 2*b*, and the third blue light emitting element 2*c* is a lateral-type LED die, which includes a first type semiconductor layer 21, a second type semiconductor layer 22, an active layer 23, and two electrodes 24, 25. The first type semiconductor layer 21 is close to the color conversion structure 4. The second type semiconductor layer 22 is close to the backplane 1. The active layer 23 is disposed between the first type semiconductor layer 21 and the second type semiconductor layer 22. The electrode 24 is disposed on the first type semiconductor layer 21 to face towards the color conversion structure 4, and the electrode 25 is disposed on the second type semiconductor layer 22 to face towards the color conversion structure 4.

Furthermore, the backplane 1 has a plurality of connection pads P disposed thereon. In the present embodiment, the connection pads P are alternately arranged with the first blue light emitting element 2*a*, the second blue light emitting element 2*b*, and the third blue light emitting element 2*c*, and the two electrodes 24, 25 of the first blue light emitting element 2*a*, the second blue light emitting element 2*b*, or the third blue light emitting element 2*c* are electrically connected to two of the connection pads P. More specifically, each of the two electrodes 24, 25 of the first blue light emitting element 2*a*, the second blue light emitting element 2*b*, or the third blue light emitting element 2*c* is connected to the adjacent connection pad P via a conductive wire structure 27.

Third Embodiment

Referring to FIG. 3, each of the first blue light emitting element 2*a*, the second blue light emitting element 2*b*, and the third blue light emitting element 2*c* is a vertical-type LED die, which includes a first type semiconductor layer 21, a second type semiconductor layer 22, an active layer 23, and an electrode 24. The first type semiconductor layer 21 is close to the color conversion structure 4. The second type semiconductor layer 22 is close to the backplane 1. The active layer 23 is disposed between the first type semiconductor layer 21 and the second type semiconductor layer 22.

The electrode 24 is disposed on the second type semiconductor layer 22 to face towards the backplane 1.

Furthermore, the display device Z further includes a circuit layer 5 disposed on the protective layer 3, and the backplane 1 has a plurality of connection pads P disposed thereon. In the present embodiment, the circuit layer 5 is electrically connected to the backplane 1. The first type semiconductor layer 21 of the first blue light emitting element 2a, the second blue light emitting element 2b, or the third blue light emitting element 2c is electrically connected to the circuit layer 5. The electrode 24 of the first blue light emitting element 2a, the second blue light emitting element 2b, or the third blue light emitting element 2c is electrically connected to the corresponding connection pad P. More specifically, the circuit layer 5 is electrically connected to the backplane 1 via a conductive through hole (not numbered). The electrode 24 of the first blue light emitting element 2a, the second blue light emitting element 2b, or the third blue light emitting element 2c is connected to the corresponding connection pad P via a conductive bump (not numbered).

Beneficial Effects of the Embodiments

In conclusion, in the display device having a wide color gamut provided by the present disclosure, by virtue of "the protective layer encapsulating the first blue light emitting element, the second blue light emitting element, and the third blue light emitting element in a lateral direction to expose a light emitting surface of each of the first blue light emitting element, the second blue light emitting element, and the third blue light emitting element," and "the protective layer having a transmittance of 10% or less of light having a wavelength greater than 380 nm and less than 500 nm," undesired or excess blue light in the device can be eliminated, thereby avoiding degradation of color gamut caused by side light interference between sub-pixels, and blue light from the external environment can be blocked from negatively affecting display effect.

More specifically, in the color conversion structure, the first blue light-cutoff sheet and the second blue light-cutoff sheet also have a transmittance of 10% or less of light having a wavelength greater than 380 nm and less than 500 nm, and can have a synergistic or cooperative effect with the protective layer to improve the color purity of the sub-pixels and increase display color gamut.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A display device, comprising:
a backplane having a first area, a second area, and a third area arranged at intervals;
a light emitting group disposed on the backplane and including a first blue light emitting element located in the first area, a second blue light emitting element located in the second area, and a third blue light emitting element located in the third area;
a protective layer disposed on the backplane and encapsulating the first blue light emitting element, the second blue light emitting element, and the third blue light emitting element in a lateral direction to expose a light emitting surface of each of the first blue light emitting element, the second blue light emitting element, and the third blue light emitting element, wherein the protective layer includes a yellow absorbing material that is a yellow organic pigment, a yellow inorganic pigment, or a combination thereof; and
a color conversion structure including:
a red conversion unit disposed on the light emitting surface of the first blue light emitting element and including a red conversion sheet and a first blue light-cutoff sheet disposed on the red conversion sheet;
a green conversion unit disposed on the light emitting surface of the second blue light emitting element and including a green conversion sheet and a second blue light-cutoff sheet disposed on the green conversion sheet;
a light-permeable unit disposed on the light emitting surface of the third blue light emitting element; and
a black matrix disposed between the red conversion unit, the green conversion unit, and the light-permeable unit;
wherein both the first blue light-cutoff sheet and the second blue light-cutoff sheet have a transmittance of 10% or less of light having a wavelength greater than 380 nm and less than 500 nm, and the protective layer is a transparent layer; and
wherein each of the first blue light-cutoff sheet and the second blue light-cutoff sheet is formed from a photoresist material, and the photoresist material includes the yellow absorbing material accounting for 5 wt % to 20 wt % of a total weight thereof.

2. The display device according to claim 1, wherein the yellow absorbing material is bismuth vanadate ($BiVO_4$).

3. The display device according to claim 2, wherein the protective layer is a photoresist layer.

4. The display device according to claim 1, wherein the color conversion structure includes a cover board that has an inner surface close to the light emitting group, and the red conversion unit, the green conversion unit, the light-permeable unit, and the black matrix are formed on the inner surface.

5. The display device according to claim 1, wherein each of the first blue light emitting element, the second blue light emitting element, and the third blue light emitting element includes a first type semiconductor layer, a second type semiconductor layer, an active layer, and two electrodes, the first type semiconductor layer is close to the backplane, the second type semiconductor layer is close to the color conversion structure, the active layer is disposed between the first type semiconductor layer and the second type semiconductor layer, and the two electrodes are disposed on the first type semiconductor layer to face towards the backplane and electrically connected to the first type semiconductor layer and the second type semiconductor layer, respectively; each of the first area, the second area, and the third area has two connection pads disposed therein, the two electrodes of the first blue light emitting element are respectively and electrically connected to the two connection pads of the first area, the two electrodes of the second blue light emitting element are respectively and electrically connected to the two connection pads of the second area, and the two electrodes of the third blue light emitting element are respectively and electrically connected to the two connection pads of the third area.

6. The display device according to claim 1, wherein each of the first blue light emitting element, the second blue light emitting element, and the third blue light emitting element includes a first type semiconductor layer, a second type semiconductor layer, an active layer, and two electrodes; wherein the first type semiconductor layer is close to the color conversion structure, the second type semiconductor layer is close to the backplane, and the active layer is disposed between the first type semiconductor layer and the second type semiconductor layer; wherein one of the two electrodes is disposed on the first type semiconductor layer to face towards the color conversion structure, and the other of the two electrodes is disposed on the second type semiconductor layer to face towards the color conversion structure; and wherein the backplane has a plurality of connection pads disposed thereon that are alternately arranged with the first blue light emitting element, the second blue light emitting element, and the third blue light emitting element, and the two electrodes of the first blue light emitting element, the second blue light emitting element, or the third blue light emitting element are electrically connected to the corresponding two of the connection pads.

7. The display device according to claim 1, wherein each of the first blue light emitting element, the second blue light emitting element, and the third blue light emitting element includes a first type semiconductor layer, a second type semiconductor layer, an active layer, and an electrode; wherein the first type semiconductor layer is close to the color conversion structure, the second type semiconductor layer is close to the backplane, the active layer is disposed between the first type semiconductor layer and the second type semiconductor layer, and the electrode is disposed on the second type semiconductor layer to face towards the backplane; and wherein the display device includes a circuit layer disposed on the protective layer, the backplane has a plurality of connection pads disposed thereon, the first type semiconductor layer of the first blue light emitting element, the second blue light emitting element, or the third blue light emitting element is electrically connected to the circuit layer, and the electrode of the first blue light emitting element, the second blue light emitting element, or the third blue light emitting element is electrically connected to the corresponding one of the connection pads.

* * * * *